(12) United States Patent
Nukui (10) Patent No.: US 10,277,004 B2
(45) Date of Patent: Apr. 30, 2019

(54) LASER DEVICE

(71) Applicant: FANUC CORPORATION, Yamanashi (JP)

(72) Inventor: Tooru Nukui, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/837,159

(22) Filed: Dec. 11, 2017

(65) Prior Publication Data

US 2018/0166852 A1 Jun. 14, 2018

(30) Foreign Application Priority Data

Dec. 14, 2016 (JP) ................................ 2016-242504

(51) Int. Cl.
*H01S 3/04* (2006.01)
*H01S 5/024* (2006.01)
(Continued)

(52) U.S. Cl.
CPC ...... *H01S 5/02423* (2013.01); *H01S 5/02438* (2013.01); *H01S 5/02446* (2013.01);
(Continued)

(58) Field of Classification Search
CPC ............... H01S 5/02423; H01S 5/0612; H01S 5/06804; H01S 5/02415; H01S 5/02438; H01S 5/02446; H01S 5/06825
See application file for complete search history.

(56) References Cited

U.S. PATENT DOCUMENTS

| 2002/0141775 A1* | 10/2002 | Mitsuoka ........... G03G 15/2042 399/69 |
| 2003/0063887 A1* | 4/2003 | Seal ................... G02B 6/02176 385/134 |

(Continued)

FOREIGN PATENT DOCUMENTS

| CN | 1756007 A | 4/2006 |
| CN | 101465509 A | 6/2009 |

(Continued)

OTHER PUBLICATIONS

An Office Action; "Notification of Reasons for Refusal," mailed by the Japanese Patent Office dated Mar. 20, 2018, which corresponds to Japanese Patent Application No. 2016-242504 and is related to U.S. Appl. No. 15/837,159, with brief English language translation.

(Continued)

*Primary Examiner* — Kinam Park
(74) *Attorney, Agent, or Firm* — Studebaker & Brackett PC (57) ABSTRACT

To provide a laser device capable of detecting overheating (abnormality) of a heat-generating part by detecting a temperature of a cooling member for cooling the heat-generating part. A laser device includes one or a plurality of heat-generating part(s), one or a plurality of cooling member(s) respectively disposed in contact with the one or plurality of heat-generating part(s), the one or plurality of cooling member(s) containing a refrigerant flowing inside, one or a plurality of first temperature detection part(s) respectively disposed on the one or plurality of cooling member(s) to respectively detect temperatures of the one or plurality of cooling member(s), and a monitoring part capable of detecting an abnormality respectively in the one or plurality of cooling member(s) based on temperature information including information on the temperatures detected by the one or plurality of first temperature detection part(s).

10 Claims, 5 Drawing Sheets

(51) Int. Cl.
  *H01S 5/06* (2006.01)
  *H01S 5/0683* (2006.01)
  *H01S 5/40* (2006.01)
  *H01S 5/068* (2006.01)

(52) U.S. Cl.
  CPC ...... *H01S 5/02453* (2013.01); *H01S 5/02461* (2013.01); *H01S 5/0612* (2013.01); *H01S 5/06837* (2013.01); *H01S 5/4025* (2013.01); *H01S 5/02415* (2013.01); *H01S 5/0617* (2013.01); *H01S 5/06804* (2013.01); *H01S 5/06825* (2013.01)

(56) References Cited

U.S. PATENT DOCUMENTS

| | | | |
|---|---|---|---|
| 2006/0013274 A1 | 1/2006 | Nishikawa et al. | |
| 2011/0315354 A1* | 12/2011 | Johnson | H05K 7/20254 165/104.33 |

FOREIGN PATENT DOCUMENTS

| | | |
|---|---|---|
| JP | S5796648 A | 6/1982 |
| JP | H1235390 A | 9/1989 |
| JP | H263179 A | 3/1990 |
| JP | H0511471 U | 2/1993 |
| JP | 2002-076500 A | 3/2002 |
| JP | 2003-283038 A | 10/2003 |
| JP | 2006-054408 A | 2/2006 |
| JP | 2007-163193 A | 6/2007 |
| JP | 2012-059993 A | 3/2012 |
| JP | 2016-184506 A | 10/2016 |

OTHER PUBLICATIONS

An Office Action mailed by the State Intellectual Property Office dated Oct. 8, 2018, which corresponds to Chinese Patent Application No. 201711319193.7 and is related to U.S. Appl. No. 15/837,159.

* cited by examiner

FIG. 1

(a)   NORMAL STATE (b)   STATE OF LASER CAVITY 12A HAVING ABNORMALITY (c)   STATE OF COOLING EQUIPMENT HAVING ABNORMALITY

(a) STATE OF POWER SOURCE ELEMENT AND LASER CAVITY 12A EACH HAVING ABNORMALITY (b) STATE AFTER ADJUSTMENT

LASER DEVICE

This application is based on and claims the benefit of priority from Japanese Patent Application No. 2016-242504, filed on 14 Dec. 2016, the content of which is incorporated herein by reference.

BACKGROUND OF THE INVENTION

Field of the Invention

The present invention relates to a laser device. More specifically, the present invention relates to a laser device including a cooling member for cooling a heat-generating part.

Related Art

A conventional laser device such as a semiconductor laser device has heat-generating parts such as a plurality of laser cavities and an optical component. Each of such heat-generating parts is cooled by a cooling member utilizing cooling water supplied by an external cooling device. The cooling water circulates between the cooling device and the cooling member, so as to be supplied from the cooling device to the cooling member through a supply passage connecting between the cooling device and the cooling member, and to be discharged from the cooling member to the cooling device.

If the cooling water contains foreign matter such as dust, the flow amount thereof may decrease, and a heat-generating member may be damaged by overheating, in some cases. In response to this, a laser device is disclosed, which maintains cleanliness of circulating cooling water and a circulation passage (refer to Patent Document 1, as an example). However, although this technology is able to suppress reduction in flow amount of the cooling water to a certain extent, it is not able to detect overheating or the like of the heat-generating part.

A method for monitoring reduction in flow amount by use of a flowmeter is well known. However, this technology has some problems, including the problem that an accurate flow amount is not detectable when foreign matter is attached to a flowmeter, that space is required for arrangement of a flowmeter, and that a flowmeter is expensive in cost. Furthermore, since many heat-generating parts are disposed inside a laser device (oscillator), a large number of flowmeters corresponding to these parts are required, and thus the above-mentioned problems become greater.

Another technology is disclosed, for detecting a temperature of cooling water instead of a flow amount of cooling water. As an example, a light source device is disclosed, which detects a decrease in cooling capability of a heat sink due to a problem of cooling water, based on a reference temperature and a detected temperature of a current control element, and a reference temperature and a detected temperature of the heat sink (refer to Patent Document 2, as an example). A laser device is also disclosed, which detects a temperature of cooling water to detect an abnormality in a cooling mechanism depending on whether or not the detected temperature of the cooling water falls within a predetermined range (refer to Patent Document 3).

Patent Document 1: Japanese Unexamined Patent Application, Publication No. 2006-54408
Patent Document 2: Japanese Unexamined Patent Application, Publication No. 2016-184506
Patent Document 3: Japanese Unexamined Patent Application, Publication No. 2012-59993

SUMMARY OF THE INVENTION

However, in the technology disclosed in Patent Document 2, there is a problem that, although temperature of a current control element, which is a heat-generating part, is measured by directly attaching a temperature measuring terminal to the current control element, a temperature of a laser cavity which is another heat-generating part is difficult to be measured directly.

In the technology disclosed in Patent Document 3, there is another problem that, although an abnormality in a cooling mechanism is detected through detection of a temperature of the cooling water, which specific part of the cooling mechanism has a problem cannot be detected.

Additionally, in the technologies in Patent Document 2 and Patent Document 3, there are problems that a temperature measuring element and the like are expensive and that the attachment thereof takes time.

The object of the present invention is to provide a laser device capable of detecting overheating (abnormality) of a heat-generating part by detecting a temperature of a cooling member for cooling the heat-generating part.

(1) The present invention relates to a laser device (for example, a semiconductor laser device 1, which is described below) including one or a plurality of heat-generating part(s) (for example, a power source element 11, laser cavities 12A to 12N, and an optical component 13, which are described below), one or a plurality of cooling member(s) (for example, cooling plates 21, 22A to 22N, 23, which are described below) being respectively disposed in contact with the one or plurality of heat-generating parts and containing a refrigerant flowing inside, one or a plurality of first temperature detection part(s) (for example, temperature detection parts 31, 32A to 32N, 33, which are described below) respectively disposed on the one or plurality of cooling members to respectively detect the temperatures of the one or plurality of cooling members, and a monitoring part (for example, a monitoring part 101, which is described below) capable of detecting an abnormality respectively in the one or plurality of cooling members based on temperature information including information on the temperatures detected by the one or plurality of first temperature detection parts.

(2) The laser device according to (1) further includes a refrigerant passage (for example, cooling water passage 50, which is described below) which connects a cooling device (for example, a cooling equipment 200, which is described below) disposed externally and the one or plurality of cooling members so as to allow the refrigerant to circulate inside, and which includes a supply passage (for example, a supply passage 52, which is described below) for supplying the refrigerant from the cooling device to the one or plurality of cooling members, and a discharge passage (for example, a discharge passage 56, which is described below) for returning the refrigerant from the one or plurality of cooling members to the cooling device, and a second temperature detection part (for example, a temperature detection part 35, which is described below) disposed on the supply passage to detect a temperature of the supply passage (for example, a cooling water intake part 40, which is described below). In the laser device, the monitoring part may detect an abnormality in the one or plurality of cooling members respectively, based on the temperature information including the information on the temperatures detected by the one or plurality of first temperature detection parts and information on the temperatures detected by the second temperature detection part.

(3) In the laser device according to (1) or (2), the monitoring part may calculate temperature integration information and/or temperature differential information corresponding to each of the one or plurality of cooling members based on the information included in the temperature information, and may further detect an abnormality in the one or plurality of cooling members respectively, based on the calculated temperature integration information and/or the calculated temperature differential information corresponding to each of the one or plurality of cooling members.

(4) The laser device according to (3) further includes one or a plurality of adjustment part(s) (for example, adjustment parts 141, 142A to 142N, 143, which are described below) capable of adjusting a temperature and/or a supply amount of the refrigerant supplied to the one or plurality of cooling members, and a control unit (for example, a control unit 130, which is described below) capable of giving an instruction with respect to the temperature and/or the supply amount of the refrigerant to the one or plurality of adjustment parts. In the laser device, the monitoring part may output, when detecting the abnormality, abnormality detection information including the contents of the detected abnormality to the control unit, and the control unit may give the instruction for adjusting the temperature and/or the supply amount of the refrigerant to the one or plurality of adjustment parts based on the abnormality detection information output by the monitoring part.

(5) The laser device according to (4) further includes a housing (for example, a housing 5, which is described later) for housing at least the one or plurality of heat-generating parts, the one or plurality of first temperature detection parts, and the one or plurality of cooling members, and an internal environment detection part (for example, a temperature/humidity detection part 38, which is described below) capable of detecting a temperature and/or a humidity of an internal space in the housing. In the laser device, the control unit may give the instruction for adjusting the temperature and/or the supply amount of the refrigerant to the one or plurality of adjustment parts, based on the temperature and/or the humidity detected by the internal environment detection part, and the temperatures detected by the one or plurality of the first temperature detection parts.

The present invention is able to provide a laser device capable of detecting overheating (abnormality) of a heat-generating part by detecting a temperature of a cooling member for cooling the heat-generating part.

DETAILED DESCRIPTION OF THE INVENTION

Some embodiments of the present invention are described below with reference to the drawings. In the following descriptions with regard to the second embodiment and its succeeding embodiments, the same reference numerals are given to the components common to the first embodiment, and the description thereof is omitted.

First Embodiment

Figure 1:
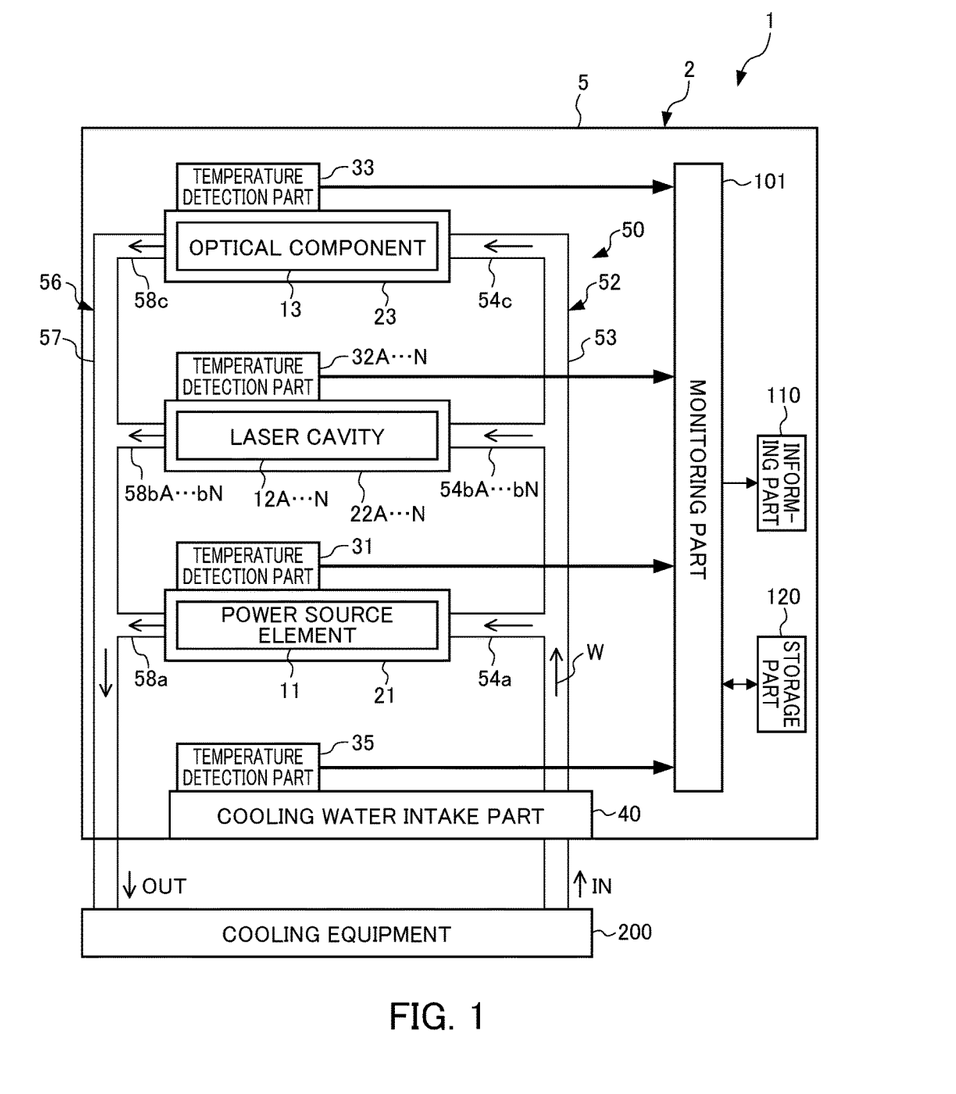
FIG. 1 is a block diagram illustrating a configuration of a laser device according to a first embodiment of the present invention.

First, a semiconductor laser device 1 (laser device) is described with reference to FIG. 1. FIG. 1 is a block diagram illustrating a configuration of a laser device according to the first embodiment of the present invention. The semiconductor laser device 1, which is a semiconductor laser device such as of a fiber laser or the like, has a laser oscillator 2 for resonating a laser beam to be output, as shown in FIG. 1. The laser oscillator 2 has a housing 5, with various members and the like housed and disposed inside the housing 5. The laser oscillator 2 is connected to a cooling equipment 200 (cooling device) which is disposed externally, so that cooling water W (refrigerant) can circulate therebetween.

The laser oscillator 2 has one or a plurality of heat-generating part(s). In the present embodiment, the laser-oscillator 2 includes a power source element 11 (heat-generating part), a plurality of laser cavities 12A to 12N (heat-generating parts), and an optical component 13 (heat-generating part). Each of these heat-generating parts needs to be cooled in order to suppress a decline in functionality and the like due to an increase in temperature. In particular, a laser cavity needs to be cooled because thermal energy of, for example, several tens of watts is generated proportionately to the optical output energy.

The power source element 11, which is a heat-generating part, is cooled a cooling plate 21. The power source element 11 is disposed in contact with the cooling plate 21.

The plurality of laser cavities 12A to 12N, which are heat-generating parts, are cooled by cooling plates 22A to 22N, respectively. The plurality of laser cavities 12A to 12N are disposed in contact with the cooling plates 22A to 22N, respectively.

The optical component 13, which is a heat-generating part, is cooled by a cooling plate 23. The optical component 13 is disposed in contact with the cooling plate 23.

The laser oscillator 2 further has one or a plurality of cooling member(s) respectively disposed in contact with one or a plurality of heat-generating part(s). In the present embodiment, the laser oscillator 2 includes the cooling plate 21 (cooling member) placed on the power source element 11, the cooling plates 22A to 22N (cooling members) respectively placed on the laser cavities 12A to 12N, and the cooling plate 23 (cooling member) placed on the optical component 13.

The cooling plate 21 is a member placed on the power source element 11 to cool the power source element 11. The cooling plate 21 is configured to contain, for example, a plurality of electrothermal plate members disposed in layers so that the cooling water W can flow through each layer. A temperature detection part 31 (described below) is disposed on the cooling plate 21 to detect the temperature of the cooling plate 21.

The cooling plates 22A to 22N are members respectively placed on the laser cavities 12A to 12N to cool the laser cavities 12A to 12N. For example, each of the cooling plates 22A to 22N is configured to contain a plurality of electrothermal plate members disposed in layers so that the cooling water W can flow through each layer. Temperature detection parts 32A to 32N (described below) are respectively disposed on the cooling plates 22A to 22N to detect the temperatures of the cooling plates 22A to 22N.

The cooling plate 23 is a member placed on the optical component 13 to cool the optical component 13. For example, the cooling plate 23 is configured to contain, for example, a plurality of electrothermal plate members disposed in layers so that the cooling water W can flow through each layer. A temperature detection part 33 (described below) is disposed on the cooling plate 23 to detect the temperature of the cooling plate 23.

The laser oscillator 2 further has one or a plurality of first temperature detection part(s) which are respectively placed on one or a plurality of cooling member(s) so as to be capable of respectively and continuously detecting the temperature(s) of the one or plurality of cooling member(s). In the present embodiment, the laser oscillator 2 includes the temperature detection part 31 (first temperature detection part), the temperature detection parts 32A to 32N (first temperature detection parts), and the temperature detection part 33 (first temperature detection part).

The temperature detection part 31 is placed on the cooling plate 21 on which the power source element 11 is placed. In the present embodiment, the temperature detection part 31 is a thermistor. The temperature detection part 31 is disposed in the downstream side of the flowing direction of the cooling water W on the cooling plate 21. The temperature detection part 31 detects the temperature of the downstream side in the flowing direction of the cooling water W in the cooling plate 21. The temperature detection part 31 indirectly detects, via the cooling plate 21, the temperature of the cooling water W after cooling of the power source element 11. The temperature detection part 31 continuously outputs information on the detected temperature to a monitoring part 101.

Similarly, the temperature detection parts 32A to 32N are placed on the cooling plates 22A to 22N on which the laser cavities 12A to 12N are placed, respectively. In the present embodiment, the temperature detection parts 32A to 32N are thermistors. Each of the temperature detection parts 32A to 32N is disposed in the downstream side of the flowing direction of the cooling water W on the cooling plates 22A to 22N. The temperature detection parts 32A to 32N respectively detect the temperatures of the downstream side in the flowing direction of the cooling water W in the cooling plates 22A to 22N. The temperature detection parts 32 indirectly and respectively detect, via the cooling plates 22A to 22N, the temperature of the cooling water W after cooling of the laser cavities 12A to 12N. Each of the temperature detection parts 32A to 32N continuously outputs information on the detected temperature to the monitoring part 101.

Similarly, the temperature detection part 33 is placed on the cooling plate 23 on which the optical component 13 is placed. In the present embodiment, the temperature detection part 33 is a thermistor. The temperature detection part 33 is disposed in the downstream side of the flowing direction of the cooling water W on the cooling plate 23. The temperature detection part 33 detects the temperature of the downstream side in the flowing direction of the cooling water W in the cooling plate 23. The temperature detection part 33 indirectly detects, via the cooling plate 23, the temperature of the cooling water W after cooling of the optical component 13. The temperature detection part 33 continuously outputs information on the detected temperature to the monitoring part 101.

In the present embodiment, the temperature detection parts 31, 32A to 32N, 33 are respectively disposed on the cooling plates, and thus the setting work and the replacement work thereof are performed easily. In the present embodiment, the temperature detection parts 31, 32A to 32N, 33 are thermistors, which are inexpensive and smaller in size as compared with, for example, a flowmeter or the like. Therefore, the laser oscillator 2 is enabled to be downsized and also reduced in cost.

The laser oscillator 2 includes a cooling water passage 50 (refrigerant passage) which connects the cooling equipment 200 disposed externally and the cooling plates 21, 22A to 22N, 23. The cooling water passage 50 is configured so that the cooling water W (refrigerant) can circulate between the cooling equipment 200 and the inside of the laser oscillator 2. The cooling water passage 50 includes a supply passage 52 for supplying the cooling water W from the cooling equipment 200 to the cooling plates 21, 22A to 22N, 23, and a discharge passage 56 for returning the cooling water W from the cooling plates 21, 22A to 22N, 23 to the cooling equipment 200.

The supply passage 52 includes a cooling water intake part 40 disposed in the upper stream side thereof, a main supply passage 53, and branch supply passages 54a, 54bA to 54bN, and 54c for respectively supplying the cooling water W to the cooling plates 21, 22A to 22N, 23.

The cooling water intake part 40 is a part to which the cooling water W from the cooling equipment 200 is first supplied. The cooling water intake part 40 may be a part of the main supply passage 53, or may be a part where a predetermined amount of the cooling water W stays. In the present embodiment, the cooling water intake part 40 is formed with an electrothermal member.

A temperature detection part 35 (second temperature detection part) is disposed in contact with the cooling water intake part 40. In the present embodiment, the temperature detection part 35 is placed on the cooling water intake part 40. In the present embodiment, the temperature detection part 35 is a thermistor. The temperature detection part 35 detects the temperature of the cooling water intake part 40 (supply passage 52). The temperature detection part 35 indirectly detects a temperature (T0) of the cooling water supplied to each cooling plate. The temperature detection part 35 continuously outputs information on the detected temperature to the monitoring part 101.

The discharge passage 56 includes branch discharge passages 58a, 58bA to 58bN, and 58c for respectively discharging the cooling water W from the cooling plates 21, 22A to 22N, 23, and a main discharge passage 57 joining these branch discharge passages for discharging the cooling water W to the cooling equipment 200.

The laser oscillator 2 includes the monitoring part 101, an informing part 110, and a storage part 120. The monitoring part 101 is configured to be capable of detecting an abnormality in the cooling plates 21, 22A to 22N, 23 based on temperature information including the information on the temperatures continuously detected by the temperature detection parts 31, 32A to 32N, 33. The monitoring part 101 is configured to be capable of detecting an abnormality in each of the cooling plates 21, 22A to 22N, 23 based on the temperature information including the information on the temperatures continuously detected by the temperature detection parts 31, 32A to 32N, 33. For example, when a temperature of a specific cooling plate rises, the monitoring part 101 detects an abnormality in the specific cooling plate. In this case, the cooling plate in which the abnormality has been detected may be clogged with the cooling water W in some cases. If the clogging is left as it is, the heat-generating part may be damaged by overheating.

The monitoring part 101 is further configured to be capable of detecting an abnormality in the cooling plates 21, 22A to 22N, 23 based on temperature information including the information on the temperatures continuously detected by the temperature detection parts 31, 32A to 32N, 33, and the information on the temperature continuously detected by the temperature detection part 35. For example, the monitoring part 101 calculates a difference in temperature between the temperature (T0) detected by the temperature detection part 35 and each of the temperatures (T1, TA to TN, T2) detected by the temperature detection parts 31, 32A to 32N, 33. Then, in the case where the difference in temperature with a specific cooling plate is equal to or higher than a predetermined value (threshold), the monitoring part 101 detects an abnormality in the specific cooling plate. The threshold for each cooling plate (heat-generating part) is stored in, for example, the storage part 120. Further, for example, in the case where the monitoring part 101 detects all of the temperature (T0) detected by the temperature detection part 35 and the temperatures (T1, TA to TN, T2) detected by the temperature detection parts 31, 32A to 32N, 33 rising, the monitoring part 101 detects an abnormality in the cooling equipment 200.

The monitoring part 101 further calculates temperature integration information and/or temperature differential information corresponding to each of the cooling plates 21, 22A to 22N, 23 based on the information included in the above-described temperature information, and also detects an abnormality in the cooling plates 21, 22A to 22N, 23 based on the calculated temperature integration information and/or the calculated temperature differential information corresponding to each of the cooling plates 21, 22A to 22N, 23.

Specifically, the monitoring part 101 predicts heat accumulation in each cooling plate (heat-generating part) based on the temperature integration information. In the case where the heat accumulation (temperature integration) in a cooling plate (heat-generating part) is equal to or higher than a predetermined value, the monitoring part 101 detects an abnormality in order to suppress damage by heat. The monitoring part 101 further detects a sharp rise in temperature in each cooling plate (heat-generating part) based on the temperature differential information. In the case of detecting a sharp rise in temperature based on the temperature differential information corresponding to each cooling plate, the monitoring part 101 detects an abnormality in a specific cooling plate.

In the case of detecting an abnormality, the monitoring part 101 outputs abnormality information including the contents of the abnormality to the informing part 110.

The informing part 110 performs informing of predetermined information based on the abnormality information from the monitoring part 101. For example, the informing part 110 performs informing of the cooling plate in which the abnormality has been detected, temperature information, and the like. The informing part 110 is, for example, an audio output device or a monitor.

The storage part 120 stores information on various thresholds each to be used as a detection reference by, for example, the monitoring part 101.

Figure 2:
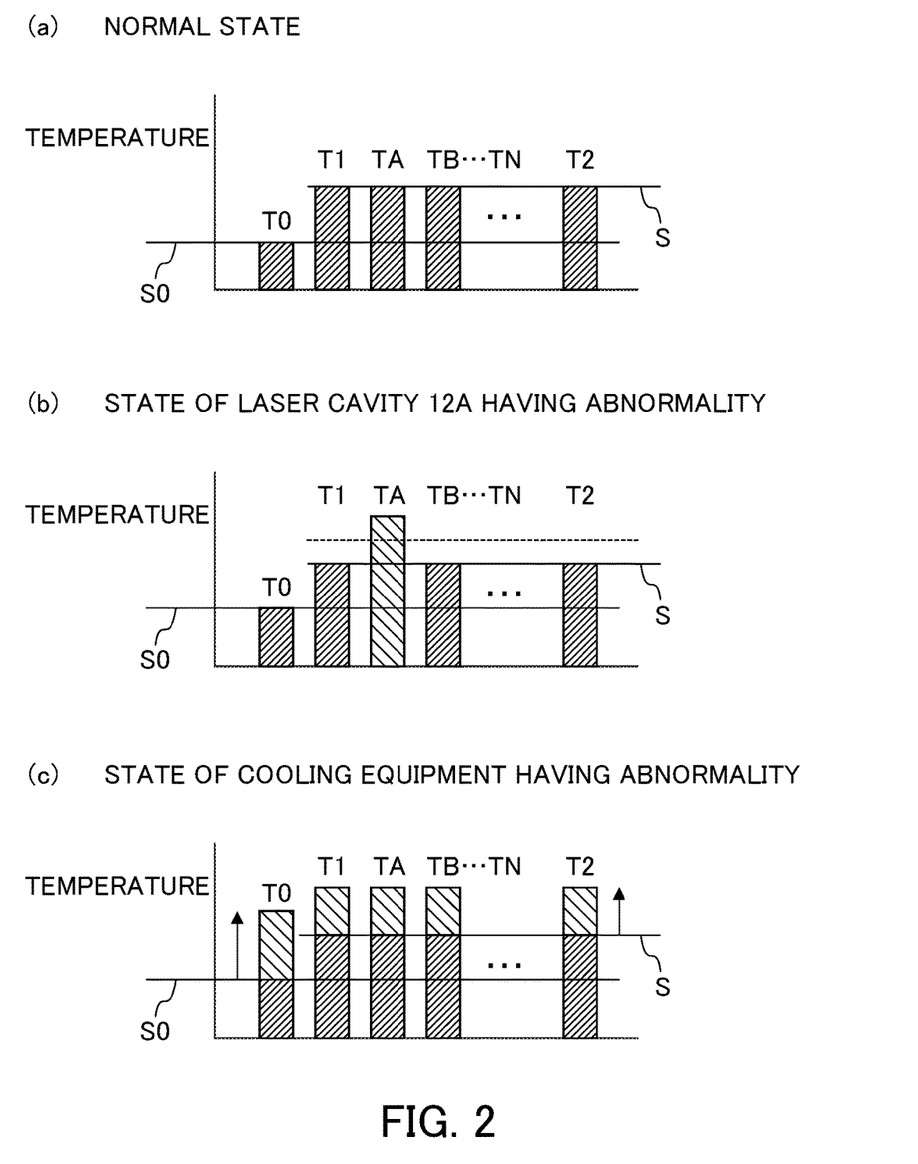
FIG. 2 is a graph illustrating temperature states of respective heat-generating parts according to the first embodiment, and is a graph illustrating a normal state in (a), a state where a laser cavity 12A has an abnormality in (b), and a state where cooling equipment has an abnormality in (c).

Next, the operation of the semiconductor laser device 1 described with reference to FIG. 2. FIG. 2 is a graph illustrating temperature states of respective heat-generating parts according to the first embodiment, and is a graph illustrating a normal state in (a), a state where the laser cavity 12A has an abnormality in (b), and a state where the cooling equipment has an abnormality in (c).

First, in the semiconductor laser device 1, the temperature detection part 35 continuously outputs information on the temperature (T0) of the cooling water intake part 40 to the monitoring part 101. The temperature detection parts 31, 32A to 32N, 33 also output information on the temperatures (T1, TA to TN, T2) in the cooling plates 21, 22A to 22N, 23 to the monitoring part 101, respectively.

Thereafter, the monitoring part 101 continuously determines whether or not the temperature from each temperature detection part falls within a certain range (within a threshold) from a predetermined reference temperature. Specifically, as shown in FIG. 2(a) to FIG. 2(c), in the present embodiment, the monitoring part 101 determines whether or not the temperature T0 falls within a predetermined range from a reference temperature S0, and further determines whether or not each of the temperature T1, the temperatures TA to TN, and the temperature T2 falls within a predetermined range from a reference temperature S.

Alternatively, the monitoring part 101 may be configured to calculate a difference in temperature with respect to each of the temperature T1, the temperatures TA to TN and the temperature T2 against the temperature T0 as a reference, and then to continuously determine whether or not each calculated difference in temperature falls within a predetermined range (within a threshold). Below, the operation of the monitoring part 101 determining whether or not the temperature T0 falls within a predetermined range from the reference temperature S0, and further determining whether or not each of the temperature T1, the temperatures TA to TN, and the temperature T2 falls within a predetermined range from the reference temperature S will be described.

As shown in FIG. 2(a), in the case where the temperature T0 falls within a predetermined range from the reference temperature S0, and currently where each of the temperature T1, the temperatures TA to TN, and the temperature T2 falls within a predetermined range from the reference temperature S, the monitoring part 101 detects no abnormalities in any of the cooling plates.

As shown in FIG. 2(b), in the case where the temperature T0 falls within a predetermined range from the reference temperature S0, and concurrently where the temperature TA is outside a predetermined range (greater than a threshold value) from the reference temperature S, the monitoring part 101 detects an abnormality in the cooling plate 22A. The monitoring part 101 outputs the detected abnormality information to the informing part 110. Then, the informing part 110 performs informing of the contents of the abnormality. Thereby, a manager or other person performs work to eliminate clogging or the like in the cooling plate 22A.

As shown in FIG. 2(c), in the case where all of the temperature T0, the temperature T1, the temperatures TA to TN, and the temperature T2 rise (exceeding a predetermined range), the monitoring part 101 detects an abnormality in the cooling equipment 200. The monitoring part 101 outputs information on the detected abnormality to the informing part 110. Then, the informing part 110 performs informing of the contents of the abnormality. Thereby, a manager or the like performs work to eliminate a problem in the cooling equipment 200.

According to the present embodiment, the following effects are produced.

More specifically, a laser device (semiconductor laser device 1) according to the present embodiment is configured to include one or a plurality of heat-generating part(s) (power source element 11, laser cavities 12A to 12N, optical component 13), one or a plurality of cooling member(s) (cooling plates 21, 22A to 22N, 23) being respectively disposed in contact with the one or plurality of heat-generating part(s) and containing a refrigerant flowing inside, one or a plurality of first temperature detection part(s) (temperature detection parts 31, 32A to 32N, 33) respectively disposed on the one or plurality of cooling member(s) to detect temperatures respectively in the one or plurality of cooling member(s), and a monitoring part (monitoring part 101) capable of detecting an abnormality in the one or plurality of cooling member(s) respectively based on temperature information including information on the temperatures detected by the one or plurality of first temperature detection part(s). This enables detection of overheating (abnormality) of a heat-generating part by detecting the temperature of the cooling member for cooling the heat-generating part. In addition, since the temperature detection parts 31, 32A to 32N, 33 are respectively disposed on the cooling plates 21, 22A to 22N, 23, the setting work and the replacement work thereof can be performed easily. In the present embodiment, the temperature detection parts 31, 32A to 32N, 33 are thermistors, which are inexpensive and smaller in size as compared with, for example, a flowmeter or the like. Therefore, the laser oscillator 2 is enabled to be downsized and also reduced in cost.

The laser device according to the present embodiment is further configured to include a refrigerant passage (cooling water passage 50) which connects a cooling device (cooling equipment 200) disposed externally and one or a plurality of cooling member(s) so as to allow a refrigerant to circulate inside, and which includes a supply passage (supply passage 52) for supplying the refrigerant from the cooling device to the one or plurality of cooling member(s) and a discharge passage (discharge passage 56) for returning the refrigerant from the one or plurality of cooling member(s) to the cooling device, and to include a second temperature detection part (temperature detection part 35) disposed on the supply passage to detect a temperature of the supply passage (cooling water intake part 40). In the laser device, the monitoring part detects an abnormality in each of the one or plurality of cooling member(s), based on temperature information including information on the temperature(s) detected by the one or plurality of first temperature detection part(s) and information on the temperature detected by the second temperature detection part. This allows the laser device (monitoring part) to more accurately detect an abnormality in the cooling members. This also allows the laser device (monitoring part) to detect an abnormality in the cooling device.

Further, in the present embodiment, the monitoring part is configured to calculate temperature integration information and/or temperature differential information corresponding to each of the one or plurality of cooling member(s) based on the information included in the temperature information, and also detect an abnormality in each of the one or plurality of cooling member(s) based on the calculated temperature integration information and/or the calculated temperature differential information corresponding to each of the one or plurality of cooling member(s). This allows the laser device (monitoring part) to detect heat accumulation and/or a sharp rise in temperature in each cooling member (heat-generating part). This also allows the laser device (monitoring part) to more accurately detect an abnormality in each cooling member.

Second Embodiment

Figure 3:
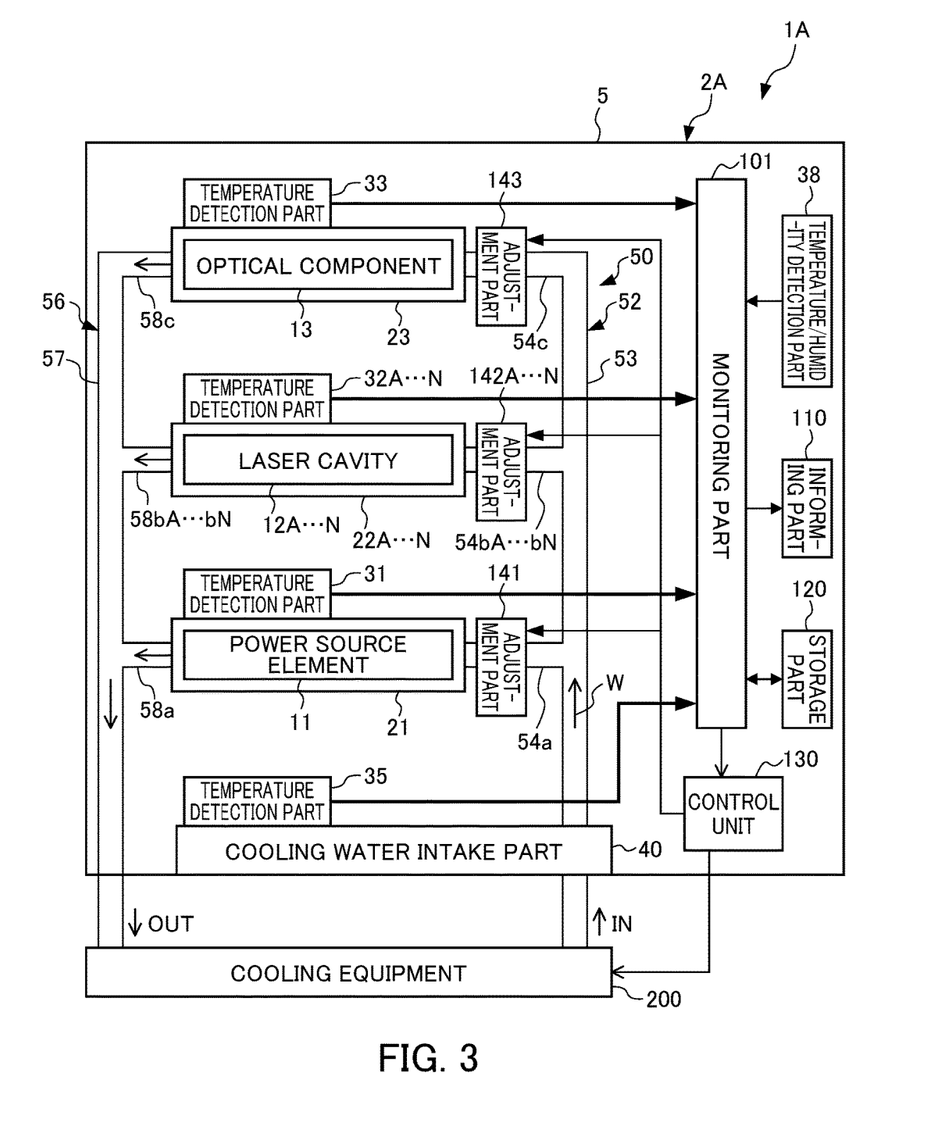
FIG. 3 is a block diagram illustrating a configuration of a laser device according to a second embodiment of the present invention.

Next, a laser device according to the second embodiment is described with reference to FIG. 3. FIG. 3 is a block diagram illustrating a configuration of a laser device according to the second embodiment of the present invention.

As shown in FIG. 3, a semiconductor laser device 1A includes a temperature/humidity detection part 38 (internal environment detection part), an adjustment part 141, adjustment parts 142A to 142N, an adjustment part 143, and a control unit 130. The temperature/humidity detection part 38 (internal environment detection part) is configured to be capable of detecting a temperature and humidity of the internal space in the housing 5. The temperature/humidity detection part 38 outputs information on the detected temperature and humidity of the internal space in the housing 5 to the monitoring part 101.

The adjustment part 141 is disposed on the branch supply passage 54a. The adjustment part 141 is configured to be capable of adjusting the flow amount and the temperature of the cooling water W supplied to the cooling plate 21 on which the power source element 11 is placed. Each of the adjustment parts 142 is configured with, for example, an electric valve and Peltier device (the same applies to other adjustment parts). The adjustment part 141 adjusts the flow amount and the temperature of the cooling water W based on an instruction from the control unit 130.

Each of the adjustment parts 142A to 142N is disposed on each of the branch supply passages 54bA to 54bN. Each of the adjustment parts 142A to 142N is configured to be capable of adjusting the flow amount and the temperature of the cooling water W supplied to each of the cooling plates 22A to 22N on which each of the laser cavities 12A to 12N is placed. Each of the adjustment parts 142A to 142N adjusts the flow amount and the temperature of the cooling water W based on an instruction from the control unit 130.

The adjustment part 143 is disposed on the branch supply passage 54c. The adjustment part 143 is configured to be capable of adjusting the flow amount and the temperature of the cooling water W supplied to the cooling plate 23 on which the optical component 13 is placed. The adjustment part 143 adjusts the flow amount and the temperature of the cooling water W based on an instruction from the control unit 130.

The control unit 130 gives an instruction for adjusting the temperature and/or the supply amount of the refrigerant to the one or plurality of adjustment parts based on the abnormality information output by the monitoring part 101. Specifically, when detecting an abnormality, the monitoring part 101 outputs the abnormality information including the detected contents of the abnormality to the control unit 130. Then, the control unit 130 gives an instruction for adjusting the temperature and/or the supply amount of the cooling water W to a specific adjustment part, based on the abnormality information output by the monitoring part 101. For example, the control unit 130 gives, to a specific adjustment part, an instruction for increasing the supply amount of the cooling water W while lowering the temperature thereof, based on information on temperature and information for specifying a cooling plate included in the abnormality information. The control unit 130 controls each adjustment part to strengthen cooling conditions of the cooling plate where the abnormality is detected, so as to prevent a corresponding heat-generating part from overheating.

The control unit 130 is configured to be capable of controlling each adjustment part for the purpose of suppressing dew condensation from being produced and eliminating the state of dew condensation inside the housing 5. The control unit 130 gives an instruction for adjusting the temperature and/or the supply amount of the cooling water to all or some of the adjustment part 141, the adjustment parts 142A to 142N, and the adjustment part 143, based on the temperature and/or the humidity detected by the temperature/humidity detection part 38, and the temperatures detected by the temperature detection parts 31, 32A to 32N, 33.

Specifically, the control unit 130 gives an instruction for raising the temperature of the cooling water W and/or reducing the supply amount of the cooling part W, to all or some of the adjustment part 141, the adjustment parts 142A to 142N, and the adjustment part 143, based on the information on dew condensation output by the monitoring part 101. The control unit 130 may set the temperature and/or the supply amount of the cooling water W mainly based on the temperature, or may perform setting based on a predetermined calculation formula or based on a predetermined database.

Figure 4:
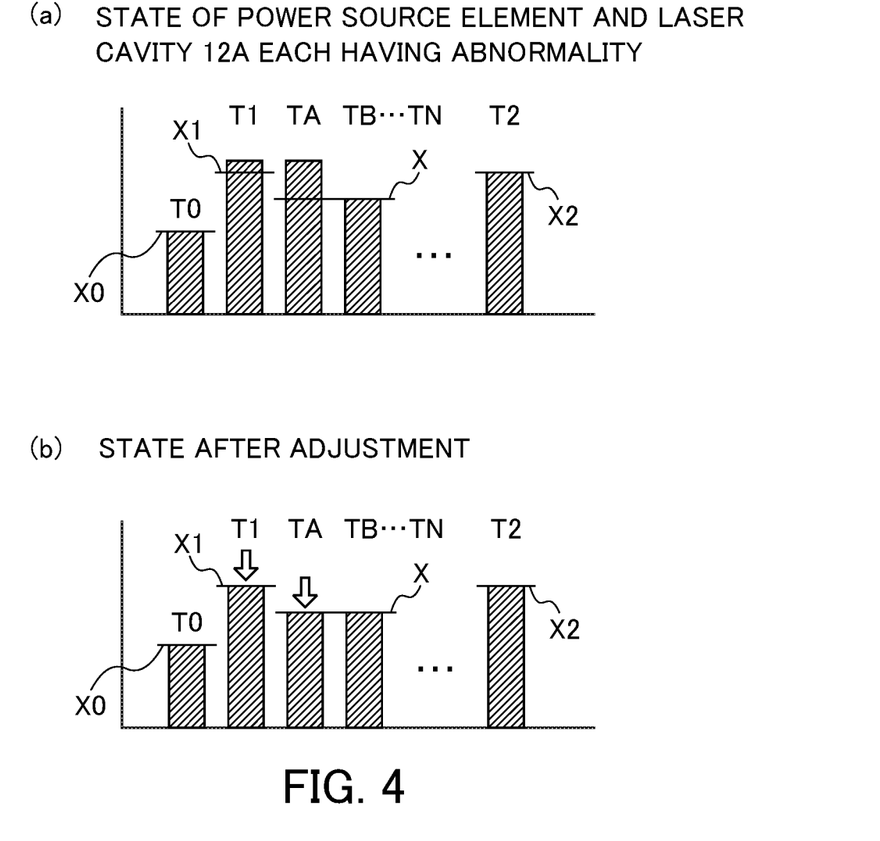
FIG. 4 is a graph illustrating temperature states of respective heat-generating parts according to the second embodiment, and is a graph illustrating a state where a power source element and a laser cavity 12A respectively have abnormalities in (a), and a state after adjustment in (b).

Next, the operation of the semiconductor laser device 1A according to the second embodiment is described with reference to FIG. 4. FIG. 4 is a graph illustrating temperature states of respective heat-generating parts according to the second embodiment, and is a graph illustrating a state where the power source element and the laser cavity 12A respectively have abnormalities in (a), and a state after the adjustment in (b).

First, in the semiconductor laser device 1A, the temperature detection part 35 continuously outputs information on the temperature (T0) of the cooling water intake part 40 to the monitoring part 101. The temperature detection parts 31, 32A to 32N, 33 also respectively output information on the temperatures (T1, TA to TN, T2) of the cooling plates 21, 22A to 22N, 23 to the monitoring part 101.

Thereafter, the monitoring part 101 continuously determines whether or not a temperature from each of the temperature detection parts exceeds a predetermined temperature (threshold). In the present embodiment, the monitoring part 101 determines whether or not the temperature T0 exceeds a threshold temperature X0, and further determines whether or not the temperature T1 exceeds a threshold temperature X1, whether or not each of the temperatures TA to TN exceeds a threshold temperature X, and whether or not the temperature T2 exceeds a threshold temperature X2.

As shown in FIG. 4(a), in the case where the temperature T1 exceeds the threshold temperature X1 and concurrently where the temperature TA exceeds the threshold temperature X, the monitoring part 101 detects an abnormality in the cooling plate 21 and the cooling plate 22A. The monitoring part 101 outputs the detected abnormality information to the informing part 110. Then, the informing part 110 performs informing of the contents of the abnormality.

The monitoring part 101 also outputs the detected abnormality information to the control unit 130. The control unit 130 controls the adjustment part 141 and the adjustment part 142A based on the abnormality information output by the monitoring part 101. Specifically, the control unit 130 gives an instruction for increasing the supply amount of the cooling water N while lowering the temperature thereof to each of the adjustment part 141 and the adjustment part 142A.

Both the adjustment part 141 and the adjustment part 142A perform adjustment so as to increase the supply amount of the cooling water N and lower the temperature thereof supplied to both the cooling plate 21 and the cooling plate 22A, based on an instruction from the control unit 130.

Next, as shown in FIG. 4(b), in the case where the temperature T1 becomes equal to or lower than the threshold temperature X1 and concurrently where the temperature TA becomes equal to or lower than the threshold temperature X, the monitoring part 101 no longer detects an abnormality in the cooling plate 21 or the cooling plate 22A. The monitoring part 101 outputs, to the informing part 110, information indicating that the abnormality has been eliminated. Thereafter, the informing part 110 stops informing of the contents of the abnormality.

The monitoring part 101 outputs, also to the control unit 130, information indicating that the abnormality has been eliminated. The control unit 130 controls the adjustment part 141 and the adjustment part 142A based on the elimination information output by the monitoring part 101. The control unit 130 gives an instruction for, for example, maintaining the temperature and the supply amount of the cooling water W to both the adjustment part 141 and the adjustment part 142A.

Both the adjustment part 141 and the adjustment part 142A adjusts, for example, the temperature and the supply amount of the cooling water W supplied to both the cooling plate 21 and the cooling plate 22A, based on an instruction from the control unit 130.

According to the present embodiment, the following effects are produced. A laser device (semiconductor laser device 1A) according to the present embodiment is configured to include one or a plurality of adjustment part(s) (adjustment parts 141, 142A to 142N, 143) capable of adjusting the temperature and/or the supply amount of the refrigerant supplied to one or a plurality of cooling member(s), and a control unit (control unit 130) capable of giving an instruction with respect to the temperature and/or the supply amount of the refrigerant to the one or plurality of adjustment part(s). In the laser device, when detecting an abnormality, a monitoring part outputs abnormality detection information including the detected contents of the abnormality to a control unit, and the control unit gives an instruction for adjusting the temperature and/or the supply amount of the refrigerant to the one or plurality of adjustment part(s) based on the abnormality detection information output by the monitoring part. This allows for automatic adjustment in the temperature and/or the supply amount of a cooling water W supplied to a cooling plate, even in the case where clogging or the like is generated in the cooling plate, thereby enabling to suppress breakage of a heat-generating part due to overheating. In addition, this also allows for a reduction of the number of times of performing maintenance work, which requires stopping of the operation thereof, to eliminate clogging or the like.

The laser device according to the present embodiment is further configured to include a housing (housing 5) which houses at least one or a plurality of heat-generating part(s), one or a plurality of first temperature detection part(s), and one or a plurality of cooling member(s), and an internal environment detection part (temperature/humidity detection part 38) capable of detecting the temperature and/or the humidity of the internal space in the housing. In the laser device, the control unit gives an instruction for adjusting the temperature and/or the supply amount of the refrigerant to the one or plurality of adjustment part(s), based on the temperature and/or the humidity detected by the internal environment detection part and the temperature(s) detected by the one or plurality of first temperature detection part(s). This enables to suppress condensation from being produced in the internal space of the housing 5, and further to eliminate the produced condensation.

Figure 5:
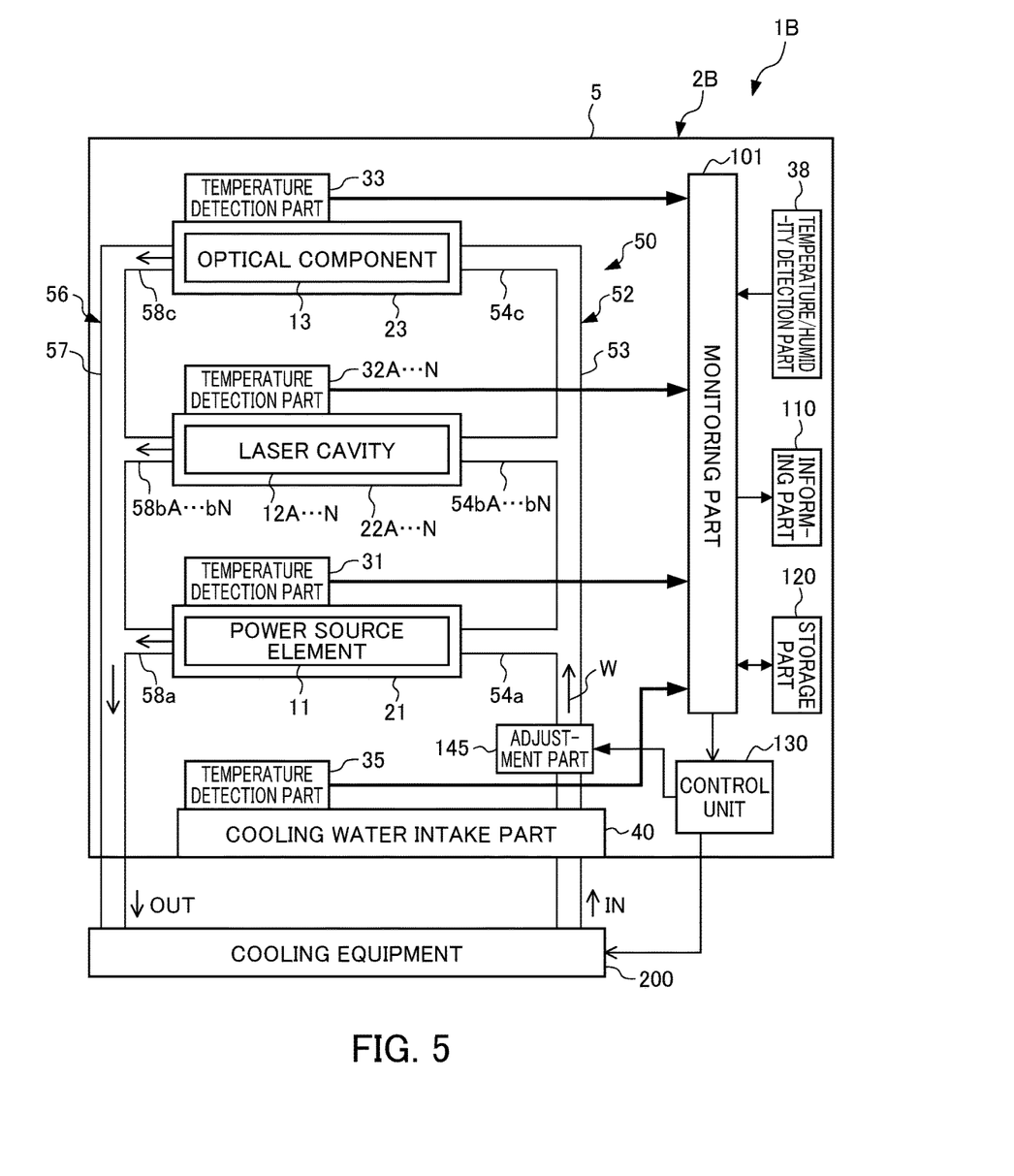
FIG. 5 is a block diagram illustrating a configuration of a laser device according to a modification of the second embodiment.

Next, a laser device according to a modification of the second embodiment is described with reference to FIG. 5. FIG. 5 is a block diagram illustrating a configuration of a laser device according to the modification of the second embodiment. The components different from those of the second embodiment are described below, and descriptions of the same components as those of the second embodiment are omitted.

As shown in FIG. 5, a laser oscillator 2B in a semiconductor laser device 1B includes an adjustment part 145. In the present modification, the laser oscillator 2B is configured to have one adjustment part 145 disposed on the main supply passage 53, instead of having a plurality of adjustment parts respectively disposed on the branch supply passages 54a, 54bA to 54bN, 54c. The adjustment part 145 unitarily adjusts the temperature and the supply amount of the cooling water W to be supplied to each of the cooling plates 21, 22A to 22N, 23 based on an instruction from the control unit 130.

The control unit 130 gives, to the adjustment part 145, an instruction for adjusting the temperature and the supply amount of the cooling water W suitable for cooling, for example, the cooling plate having the highest temperature based on the abnormality information from the monitoring part 101.

According to the present modification, the number of adjustment parts is smaller than that of the semiconductor laser device of the second embodiment, which enables a reduction in cost.

It is noted that, as another modification of the second embodiment, the plurality of adjustment parts 141, 142A to 142N, 143 may be respectively disposed on the branch supply passages 54a, 54bA to 54bN, 54c, and in addition, one adjustment part 145 may be disposed on the main supply passage 53.

The first embodiment and the second embodiment have been described so far, but the present invention is not limited to them. The present invention naturally includes modifications and improvements within the scope where the object of the present invention is achieved. In the above-described embodiments, the monitoring part, the control unit and the like are disposed inside the housing, but the present invention is not limited to such cases. Alternatively, they may be disposed, for example, outside the housing or disposed integrally with the cooling equipment.

EXPLANATION OF REFERENCE NUMERALS 1, 1A, 1B: SEMICONDUCTOR LASER DEVICE (LASER DEVICE)
2, 2A, 2B: LASER OSCILLATOR
5: HOUSING
11: POWER SOURCE ELEMENT (HEAT-GENERATING PART)
12A to 12N: LASER CAVITY (HEAT-GENERATING PART)
13: OPTICAL COMPONENT (HEAT-GENERATING PART)
21: COOLING PLATE (COOLING MEMBER)
22A to 22N: COOLING PLATE (COOLING MEMBER)
23: COOLING PLATE (COOLING MEMBER)
31: TEMPERATURE DETECTION PART (FIRST TEMPERATURE DETECTION PART)
32A to 32N: TEMPERATURE DETECTION PART (FIRST TEMPERATURE DETECTION PART)
33: TEMPERATURE DETECTION PART (FIRST TEMPERATURE DETECTION PART)
35: TEMPERATURE DETECTION PART (SECOND TEMPERATURE DETECTION PART)
38: TEMPERATURE/HUMIDITY DETECTION PART (INTERNAL ENVIRONMENT DETECTION PART)
40: COOLING WATER INTAKE PART
50: COOLING WATER PASSAGE (REFRIGERANT PASSAGE)
52: SUPPLY PASSAGE
56: DISCHARGE PASSAGE
101: MONITORING PART
110: INFORMING PART
120: STORAGE PART
130: CONTROL UNIT
141: ADJUSTMENT PART
142A to 142N: ADJUSTMENT PART
143: ADJUSTMENT PART
145: ADJUSTMENT PART
200: COOLING EQUIPMENT (COOLING DEVICE)

What is claimed is:

1. A laser device comprising:
one or a plurality of heat-generating part(s) positioned at a predetermined location or at a plurality of respective predetermined locations internal to the laser device;
one or a plurality of cooling member(s) respectively disposed in direct contact with the one or plurality of heat-generating part(s) at the predetermined internal location or the plurality of respective predetermined internal locations of the laser device, the one or plurality of cooling member(s) containing a refrigerant flowing inside;
one or a plurality of first temperature detection part(s) respectively disposed directly on the one or plurality of cooling member(s) at the predetermined internal location or the plurality of respective predetermined internal locations of the laser device alongside a respective each of the one or the plurality of cooling member(s) to respectively detect the temperatures of the one or plurality of cooling member(s), such that the respective each of the one or the plurality of heat-generating parts, a respective each of the one or a plurality of cooling members, and a respective each of the one or a plurality of first temperature detection parts are located at a respective same one of the predetermined location or the plurality of respective predetermined locations internal to the laser device; and
a monitoring part capable of detecting abnormalities respectively in the one or plurality of cooling member(s) based on temperature information including information on the temperatures detected by the one or plurality of first temperature detection part(s).

2. The laser device according to claim 1, the laser device further comprising:
a refrigerant passage connecting a cooling device disposed externally and the one or plurality of cooling member(s) so as to allow the refrigerant to circulate inside, the refrigerant passage including:
a supply passage for supplying the refrigerant from the cooling device to the one or plurality of cooling member(s); and a discharge passage for returning the refrigerant from the one or plurality of cooling member(s) to the cooling device; and a second temperature detection part disposed on the supply passage to detect a temperature of the supply passage, wherein the monitoring part detects an abnormality in the one or plurality of cooling member(s) respectively, based on the temperature information including the information on the temperatures detected by the one or plurality of first temperature detection part(s) and information on the temperature detected by the second temperature detection part.

3. The laser device according to claim 1, wherein the monitoring part calculates temperature integration information and/or temperature differential information corresponding to each of the one or plurality of cooling member(s) based on the information included in the temperature information, and further detects an abnormality in the one or plurality of cooling member(s) respectively, based on the calculated temperature integration information and/or the calculated temperature differential information corresponding to each of the one or plurality of cooling members.

4. The laser device according to claim 2, wherein the monitoring part calculates temperature integration information and/or temperature differential information corresponding to each of the one or plurality of cooling member(s) based on the information included in the temperature information, and further detects an abnormality in the one or plurality of cooling members respectively, based on the calculated temperature integration information and/or the calculated temperature differential information corresponding to each of the one or plurality of cooling member(s).

5. The laser device according to claim 3, the laser device further comprising:

one or a plurality of adjustment part(s) capable of adjusting a temperature and/or a supply amount of the refrigerant supplied to the one or plurality of cooling member(s); and a control unit capable of giving an instruction with respect to the temperature and/or the supply amount of the refrigerant to the one or plurality of adjustment part(s), wherein the monitoring part outputs, when detecting the abnormality, abnormality information including the contents of the detected abnormality to the control unit, and wherein the control unit gives the instruction for adjusting the temperature and/or the supply amount of the refrigerant to the one or plurality of adjustment part(s) based on the abnormality information output by the monitoring part.

6. The laser device according to claim 4, the laser device further comprising:

one or a plurality of adjustment part(s) capable of adjusting a temperature and/or a supply amount of the refrigerant supplied to the one or plurality of cooling member(s); and a control unit capable of giving an instruction with respect to the temperature and/or the supply amount of the refrigerant to the one or plurality of adjustment part(s), wherein the monitoring part outputs, when detecting the abnormality, abnormality information including the contents of the detected abnormality to the control unit, and wherein the control unit gives the instruction for adjusting the temperature and/or the supply amount of the refrigerant to the one or plurality of adjustment part(s) based on the abnormality information output by the monitoring part.

7. The laser device according to claim 5, the laser device further comprising:

a housing for housing at least the one or plurality of heat-generating part(s), the one or plurality of first temperature detection part(s), and the one or plurality of cooling member(s); and an internal environment detection part capable of detecting a temperature and/or a humidity of an internal space in the housing, wherein the control unit gives the instruction for adjusting the temperature and/or the supply amount of the refrigerant to the one or plurality of adjustment part(s), based on the temperature and/or the humidity detected by the internal environment detection part, and the temperatures detected by the one or plurality of the first temperature detection part(s).

8. The laser device according to claim 6, the laser device further comprising:

a housing for housing at least the one or plurality of heat-generating part(s), the one or plurality of first temperature detection part(s), and the one or plurality of cooling member(s); and an internal environment detection part capable of detecting a temperature and/or a humidity of an internal space in the housing, wherein the control unit gives the instruction for adjusting the temperature and/or the supply amount of the refrigerant to the one or plurality of adjustment part(s), based on the temperature and/or the humidity detected by the internal environment detection part, and the temperatures detected by the one or plurality of the first temperature detection part(s).

9. The laser device according to claim 1, wherein at least one of the one or plurality of cooling members is a cooling plate.

10. The laser device according to claim 1, wherein each of the one or plurality of cooling members is connected to a supply passage and a discharge passage.

* * * * *